United States Patent
Rao et al.

(10) Patent No.: US 8,320,167 B2
(45) Date of Patent: Nov. 27, 2012

(54) PROGRAMMABLE WRITE DRIVER FOR STT-MRAM

(75) Inventors: Hari M. Rao, San Diego, CA (US); Jung Pill Kim, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 181 days.

(21) Appl. No.: 12/837,779

(22) Filed: Jul. 16, 2010

(65) Prior Publication Data

US 2012/0014174 A1    Jan. 19, 2012

(51) Int. Cl.
*G11C 11/00* (2006.01)
(52) U.S. Cl. ............... 365/158; 365/189.16; 365/230.06
(58) Field of Classification Search ............. 365/158 X, 365/189.011, 189.16 X, 230.06 X, 158, 189.16, 365/230.06
See application file for complete search history.

(56) References Cited

U.S. PATENT DOCUMENTS

| | | | |
|---|---|---|---|
| 7,362,644 B2 * | 4/2008 | Yang et al. ................. | 365/225.5 |
| 7,498,844 B2 * | 3/2009 | Rho ............................... | 326/86 |
| 7,821,819 B2 * | 10/2010 | Hachino ...................... | 365/158 |
| 2002/0141246 A1 | 10/2002 | Shimizu et al. | |
| 2008/0122478 A1 | 5/2008 | Mei | |
| 2009/0109736 A1 | 4/2009 | Katou | |

FOREIGN PATENT DOCUMENTS

WO    WO2005043541 A2    5/2005

OTHER PUBLICATIONS

International Search Report and Written Opinion—PCT/US2011/044094, ISA/EPO—Oct. 21, 2011.

\* cited by examiner

*Primary Examiner* — VanThu Nguyen
(74) *Attorney, Agent, or Firm* — Sam Talpalatsky; Nicholas J. Pauley; Jonathan T. Velasco

(57) ABSTRACT

A non-volatile memory structure comprises programmable write drivers for controlling drive strengths of write operations to storage elements. The memory structure comprises a storage element coupled to a bit line, a switching element coupled to the storage element, a source line and a word line, wherein the switching element is configured to change a logic state of the storage element. A first and a second write driver with programmable drive strengths are coupled to the bit line and source line respectively to enable control of drive strengths of write operations to the storage element.

32 Claims, 7 Drawing Sheets

| w2 | w1 | w0 | s0 | s1 | s2 | s3 | s4 | s5 | s6 | s7 | Normal Cell | Easy Cell |
|---|---|---|---|---|---|---|---|---|---|---|---|---|
| 0 | 0 | 0 | 1 | 0 | 0 | 0 | 0 | 0 | 0 | 0 | cell does not flip | cell does not flip |
| 0 | 0 | 1 | 1 | 1 | 0 | 0 | 0 | 0 | 0 | 0 | cell does not flip | cell does not flip |
| 0 | 1 | 0 | 1 | 1 | 1 | 0 | 0 | 0 | 0 | 0 | cell does not flip | cell flips |
| 0 | 1 | 1 | 1 | 1 | 1 | 1 | 0 | 0 | 0 | 0 | cell does not flip | cell flips |
| 1 | 0 | 0 | 1 | 1 | 1 | 1 | 1 | 0 | 0 | 0 | cell does not flip | cell flips |
| 1 | 0 | 1 | 1 | 1 | 1 | 1 | 1 | 1 | 0 | 0 | cell does not flip | cell flips |
| 1 | 1 | 0 | 1 | 1 | 1 | 1 | 1 | 1 | 1 | 0 | cell flips | cell flips |
| 1 | 1 | 1 | 1 | 1 | 1 | 1 | 1 | 1 | 1 | 1 | cell flips - OK | cell flips - OK |

*FIG. 3B*

| Mode → | Masking | Write-0 | Write-1 | Leg-Off |
|---|---|---|---|---|
| GD | 0 | 0 | 1 | X |
| GDB | 0 | 1 | 0 | X |
| P[0] | X | 1 | 1 | 0 |
| PBL | 1 | 0 | 1 | 1 |
| NBL | 1 | 0 | 1 | 0 |
| PSL | 1 | 1 | 0 | 1 |
| NSL | 1 | 1 | 0 | 0 |

FIG. 5

| P[3] | P[2] | P[1] | P[0] | COMMENTS |
|---|---|---|---|---|
| 0 | 0 | 0 | 0 | No Legs On |
| 0 | 0 | 0 | 1 | 1 Leg On |
| 0 | 0 | 1 | 0 | 1 Leg On |
| 0 | 0 | 1 | 1 | 2 Legs On |
| 0 | 1 | 0 | 0 | 2 Legs On |
| 0 | 1 | 0 | 1 | 3 Legs On |
| 0 | 1 | 1 | 0 | 3 Legs On |
| 0 | 1 | 1 | 1 | 4 Legs On |
| 1 | 0 | 0 | 0 | 4 Legs On |
| 1 | 0 | 0 | 1 | 5 Legs On |
| 1 | 0 | 1 | 0 | 5 Legs On |
| 1 | 0 | 1 | 1 | 6 Legs On |
| 1 | 1 | 0 | 0 | 6 Legs On |
| 1 | 1 | 0 | 1 | 7 Legs On |
| 1 | 1 | 1 | 0 | 7 Legs On |
| 1 | 1 | 1 | 1 | All Legs On |

FIG. 6

PROGRAMMABLE WRITE DRIVER FOR STT-MRAM

FIELD OF DISCLOSURE

Disclosed embodiments are related to non-volatile memory elements utilizing programmable strength write drivers for writing memory storage elements. In particular disclosed embodiments are directed to write drivers of programmable drive strengths utilized in Spin Transfer Torque Magnetoresistive Random Access Memory (STT-MRAM) structures comprising Magnetic Tunnel Junction (MTJ) storage elements.

BACKGROUND

Non-volatile memory elements are capable of storing binary data, and retaining the stored memory data even when not powered by from power source. Non-volatile memory typically finds applications in memory structures directed to long-term or permanent storage of data, which may not be consistently connected to a power source. Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100 which may be utilized in a non-volatile memory structure. The STT-MRAM bit cell 100 includes a storage element (MTJ 105), a switching element (transistor 101), a bit line 102 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The spin polarized electrons tunneling through to the free layer may transfer their torque or angular momentum to the magnetic elements of the free layer, thus affecting the magnetic polarization of the free layer.

The magnetic polarization of the free layer can be reversed so that the polarity of the pinned layer and the free layer are either substantially aligned (parallel) or opposite (anti-parallel). The resistance of the electrical path through the MTJ will vary depending on the alignment of the polarizations of the pinned and free layers. This variance in resistance can be used to program and read the bit cell 100. The STT-MRAM bit cell 100 also includes a source line 104, a sense amplifier 108, read/write circuitry 106 and a bit line reference 107. Read/write circuitry 106 includes fixed strength write drivers (not shown) for the bit line 102 and source line 104. It will be appreciated that the operation and construction of the memory cell 100.

For example, the bit cell 100 may be programmed such that a binary value "1" is associated with an operational state wherein the polarity of the free layer is parallel to the polarity of the pinned layer. Correspondingly, a binary value "0" may be associated with an anti-parallel orientation between the two ferromagnetic layers. A binary value may thus be written to the bit cell by changing the polarization of the free layer. A sufficient current density (typically measured in Amperes/centimeter$^2$) generated by the electrons flowing across the tunneling barrier is required to change the polarization of the free layer. The current density required to switch the polarization of the free layer is also called switching current density. Decreasing the value of the switching current density leads to beneficially lowering the power consumption of the MTJ storage elements.

However, conventional techniques to lower the switching current density may adversely impact the thermal stability of the MTJ storage element. An MTJ storage element with low thermal stability may be unable to retain the data value written to the storage element (or storage cell), and further, cells with low thermal stability are easy to write. Such easily-writeable cells (also called "easy cells") are also susceptible to "read disturbs". Read disturbs occur when a value of "1" written to a cell, switches to "0" during a read operation, because the conventionally low current values for a read operation on an MTJ storage element are comparable and of same polarity as the current density required to write a "0" on an easy cell.

For the foregoing reasons, there is a need to appropriately decrease the current density for write operations on easy cells, while targeting a net reduction in current consumption in order to reduce power consumption of the STT-MRAM array. Conventional techniques lack the ability to detect cells that are easy to write. Further, conventional fixed strength write drivers are not programmable, and the drive strength cannot be varied in accordance with the write-ability of the cells.

SUMMARY

Exemplary embodiments are directed to a non-volatile memory element comprising a storage element coupled to a bit line, a switching element coupled to the storage element, a source line and a word line, wherein the switching element is configured to change a logic state of the storage element, a first write driver with programmable drive strength coupled to the bit line and a second write driver with programmable drive strength coupled to the source line.

Another exemplary embodiment is directed to a method of forming a non-volatile memory element comprising coupling a storage element to a bit line, coupling a switching element to the storage element, a source line and a word line, wherein the switching element is configured to change a logic state of the storage element, coupling a first write driver with programmable drive strength to the bit line; and coupling a second write driver with programmable drive strength to the source line.

Yet another exemplary embodiment is directed to a non-volatile memory element comprising means for coupling a storage element to a bit line, means for coupling a switching element to the storage element, a source line and a word line, wherein the switching element is configured to change a logic state of the storage element, means for coupling a first write driver with programmable drive strength to the bit line and means for coupling a second write driver with programmable drive strength to the source line.

Exemplary embodiments are also directed to a method of forming a non-volatile memory element comprising step for coupling a storage element to a bit line, step for coupling a switching element to the storage element, a source line and a word line, wherein the switching element is configured to change a logic state of the storage element, step for coupling a first write driver with programmable drive strength to the bit line and step for coupling a second write driver with programmable drive strength to the source line.

BRIEF DESCRIPTION OF THE DRAWINGS

The accompanying drawings are presented to aid in the description of embodiments and are provided solely for illustration of the embodiments and not limitation thereof.

FIG. 3B is a table illustrating the associations between the drive strength required to write a normal cell and an easy cell.

FIG. 5 is a table illustrating the various modes of the programming and masking logic.

FIG. 6 is a table illustrating the association between programming bits and the number of legs that are enabled in a write driver.

DETAILED DESCRIPTION

Figure 1:
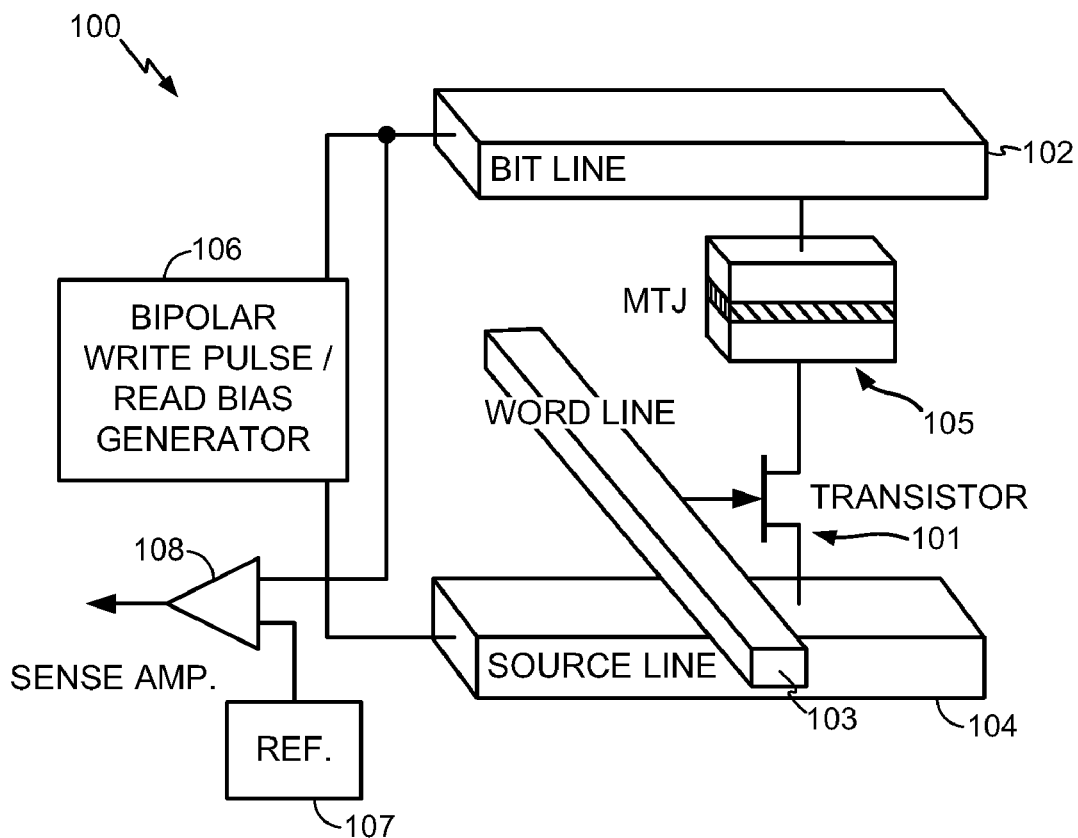
FIG. 1 illustrates a bit cell of a Magnetoresistive Random Access Memory (MRAM) array.

Aspects of the various embodiments are disclosed in the following description and related drawings directed to specific embodiments. Alternate embodiments may be devised without departing from the scope of the invention. Additionally, well-known elements of the embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. The terminology used herein is for the purpose of describing particular embodiments only and is not intended to be limiting of embodiments.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

As described in the foregoing sections, data is written to the MTJ storage elements and read out based on a reference that is the average resistance of the two states "0" and "1". It will be appreciated that the design of non-volatile memory structures such as STT-MRAM structures involves a complex trade-off between magneto-resistance and thermal stability of MTJ storage elements. Manufacturing defects may lead to MTJ storage elements with low thermal stability, easy write-ability and very low magneto-resistance. Conventional techniques lack the ability to detect easy cells in a memory array, and they further lack the ability to accordingly adjust the drive strength of the write circuitry associated with the easy cells. It will be understood that current density varies in proportion to the drive strength.

The disclosed embodiments recognize the need for variable strength programmable write drivers to address variations in "write-ability" and thermal stability of MTJ storage elements. Exemplary embodiments include techniques for controlling the drive strength of the write drivers associated with MTJ storage elements, such that the current density applied to a particular MTJ element may be varied in proportion to the write-ability of the cell. Aspects of the embodiments are also directed to techniques for detecting easy cells in a memory array. Since easy cells require lower switching current, the inventive techniques lead to advantageously lowering the net current consumed by all the MTJ storage elements in the memory array, and in turn, lower power consumption. One of ordinary skill will understand that programmable write drivers may also be advantageously employed in Design for Testability (DFT) techniques.

Exemplary embodiments are also directed to selectively turning off sections of the non-volatile STT-MRAM array in order to reduce power consumption. In an illustrative example, only 32 bits of a 128 bit wide memory array may be accessed in an exemplary memory function. Masking logic is employed to enable write operations for only the 32 bits of an exemplary word line that are accessed by the memory function. The bit line and source line associated with the MTJ storage element are driven to a logic value of "0", such that it is not possible to write the MTJ element, even if the associated word line is enabled. The masking logic effectively reduces power consumption of the memory array by eliminating the switching power associated with sections of the memory array which are not accessed by the memory function. The masking logic is integrated with the programmable write driver in exemplary embodiments.

Figure 2:
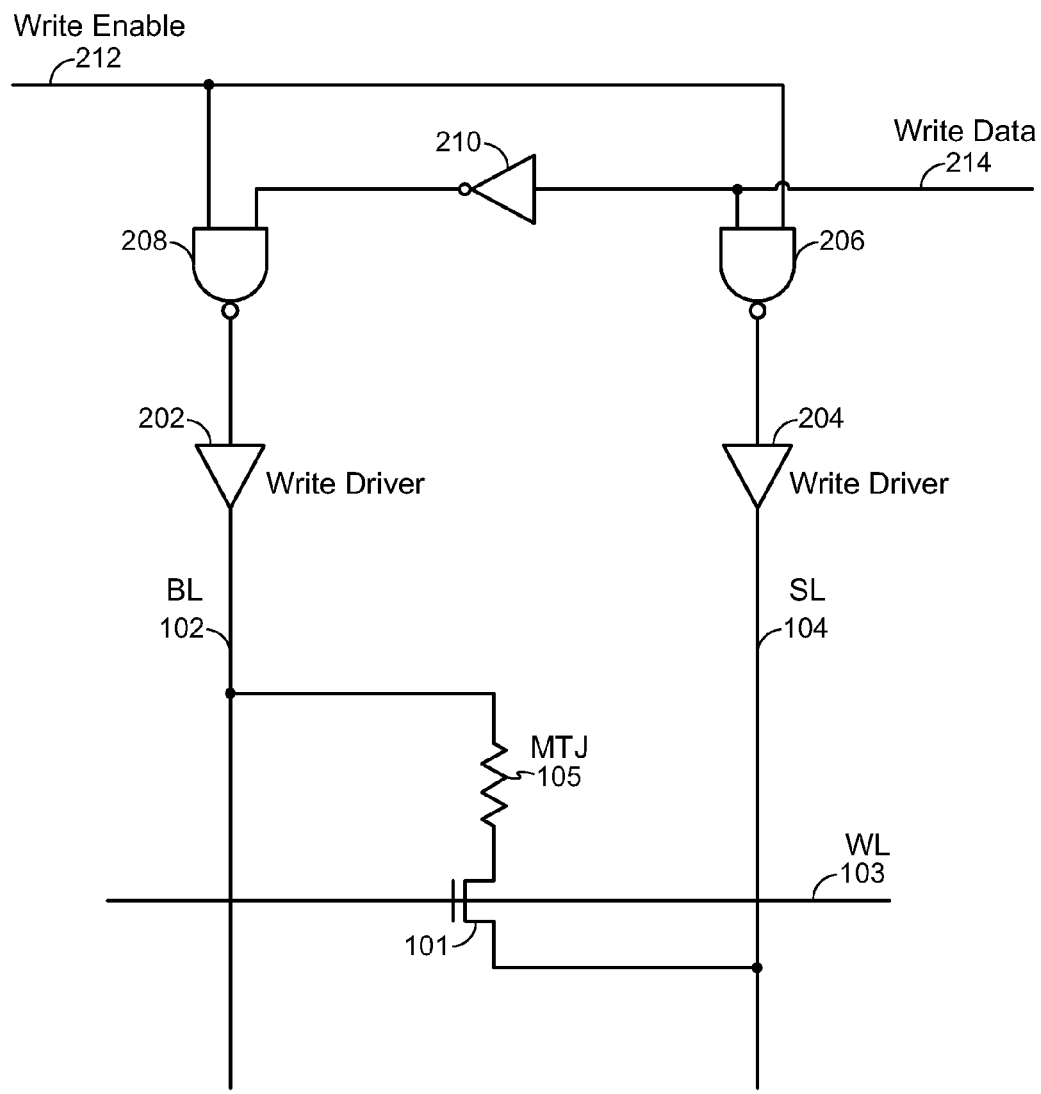
FIG. 2 is a schematic circuit diagram depicting the read/write circuitry associated with a Magnetic Tunnel Junction (MTJ) storage element.

FIG. 2 is a schematic of an exemplary read/write circuit which incorporates the inventive techniques discussed herein. In addition to the elements represented in FIG. 1, FIG. 2 also depicts write drivers 202 and 204 for bit line 102 and source line 104 respectively, NAND gates 206 and 208, and inverter 210. Write Enable 212 is used to control write operations to MTJ 105, and the data value to be written is carried on 214.

Figure 3A:
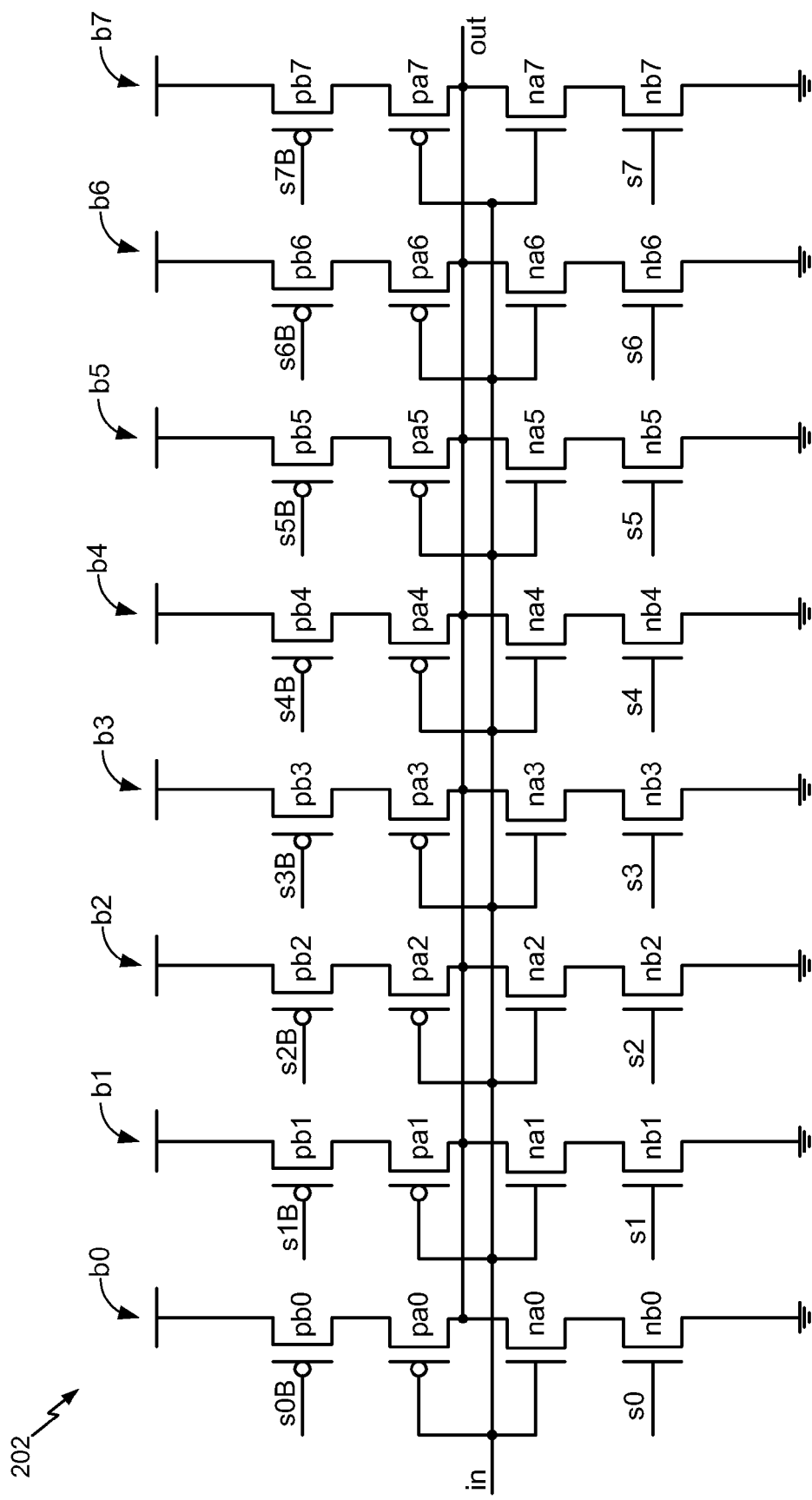
FIG. 3A illustrates an exemplary layout of a write driver formed from eight inverting buffers, wherein each buffer may be selectively disabled.

Write drivers 202 and 204 retain the layout for conventional write drivers. However, while the drive strength is fixed in conventional write drivers, the write drivers in disclosed embodiments are of programmable drive strength. FIG. 3A shows an exemplary layout of write driver 202. PMOS transistors pa0-pa7 are coupled to NMOS transistors na0-na7 to form 8 inverters electrically connected as shown. NMOS transistors nb0-nb7 and PMOS transistors pb0-pb7 may be selectively enabled by control signals s0-s7 and the complementary values of s0-s7, s0B-s7B respectively.

The strength of a signal appearing at the input terminal "in" of the driver 202 is enhanced by each of the inverting buffers b0-b7, such that the signal strength at the output terminal "out" is magnified in proportion to the number of buffers connected in parallel. In contrast to conventional write drivers wherein each of the inverting buffers are enabled when the write driver is enabled, control lines s0-s7 selectively enable each of the inverting buffers. The drive strength may be varied by controlling the number of buffers connected in parallel. When a buffer is not disabled, it is effectively isolated from the circuit, and does not contribute to the drive strength.

For example, if control signal s7 is tied to logic level "0", then the NMOS transistor nb7 is turned off, creating a high impedance path to the circuit ground. Similarly the complementary value of s7, i.e. logic level "1", appears at the gate of PMOS transistor pb7 as shown in FIG. 3A, isolating the path from the supply voltage Vss to the inverter of buffer b7. If all the other control signals, s0-s6 are at logic level "1", then there are effectively 7 buffers b0-b6 connected in parallel, and the drive strength of write driver 202 is reduced from the maximum drive strength corresponding to 8 buffers, to that of 7 buffers in parallel. Thus, by controlling s0-s7, the drive strength of write driver 202 may be programmed.

The table in FIG. 3B illustrates the difference between the drive strength required to write a normal cell versus an easy cell. As described previously, easy cells require a lower switching current density to be written, or in other words, in order to "flip" between binary states. Hence a low strength current, supplied by a write driver programmed with a low drive strength, can cause an easy cell to flip, but the current may be insufficient to cause a normal cell to flip. When all the control signals s0-s7 are set to "1" (the bottom most row in the table), write driver 202 provides the maximum drive strength, and the associated current is sufficient to flip both normal cells and easy cells. Proceeding from the bottom most row, towards the top of the table, fewer control signals s0-s7 are set to 1, and the remaining signals are set to 0. As illustrated in the top two rows of the table, two or fewer buffers are enabled, and the signal strength is so low that even the easy cells are not caused to flip. One or ordinary skill will understand how a three bit binary value w[2:0] may be used to encode the eight combinations of control signals s0-s7 depicted in the table, in order to program a range of one to eight buffers to be connected in parallel.

Figure 4:
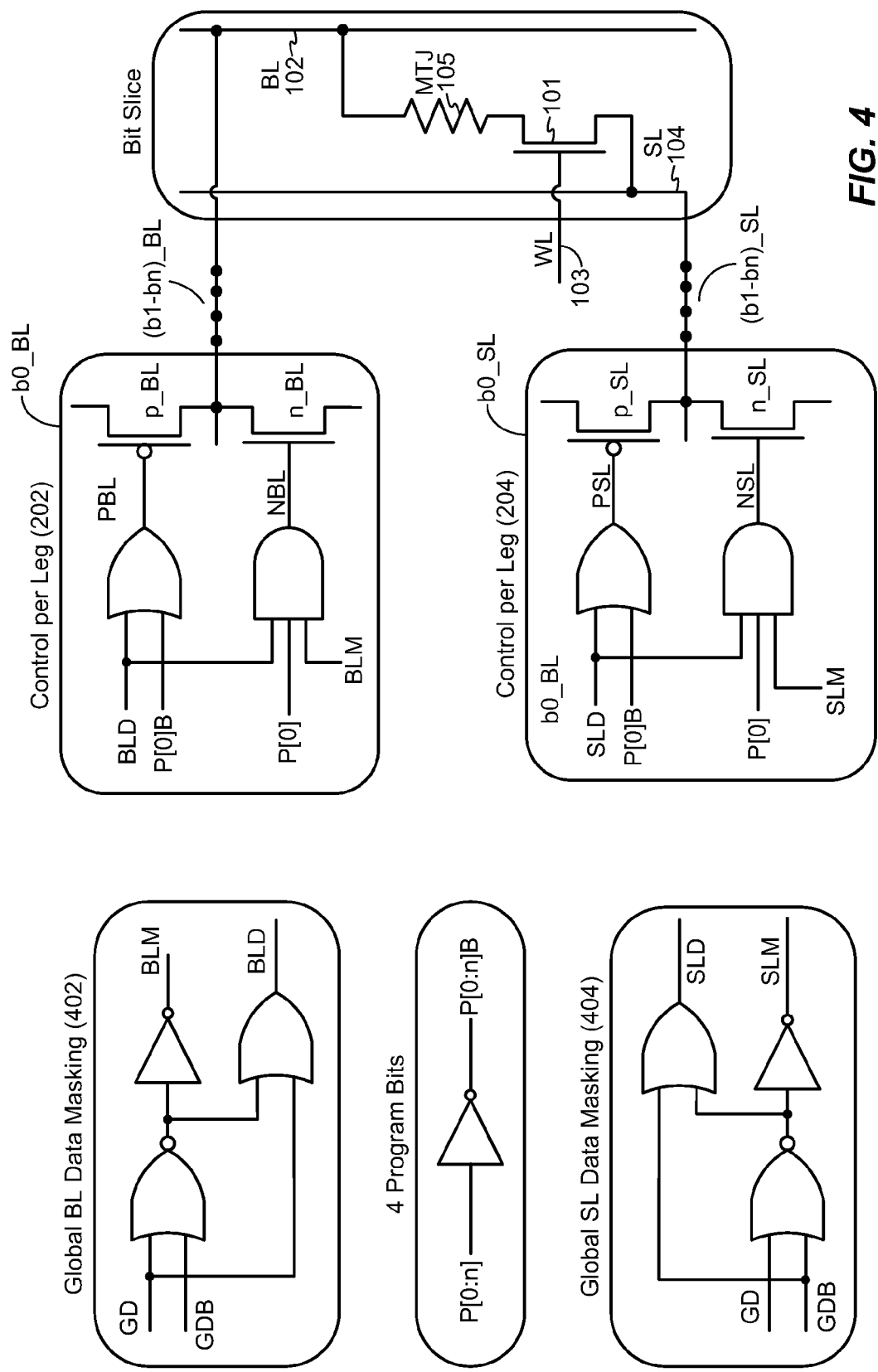
FIG. 4 is a schematic illustration of the programming and masking logic associated with an exemplary leg of a write driver.

As described previously, the inventive techniques utilize the basic layout for the buffers from conventional fixed strength write drivers. Further, masking features are also incorporated in exemplary embodiments, as will be described herein. FIG. 4 is a schematic illustrating the programmable controls per buffer (also referred to as "leg") in write drivers 202 and 204. Exemplary legs b0_BL and b0_SL of the write drivers 202 and 204 respectively are depicted in FIG. 4. It is assumed that n+1 such legs are connected in parallel to form the drivers 202 and 204. The remaining legs (b1-bn)_BL and (b1-bn)_SL are represented by dots, and since their operation is similar to the exemplary legs, they will not be explicitly discussed. In contrast to the embodiment illustrated in FIG. 3A, the pull up PMOS transistor p_BL and the pull down NMOS transistors n_BL are individually controlled and do not have their gates connected together and coupled to the same control signal. Individual control of pull up and pull down transistors serves an important function in drive strength programmability as well as in masking operations.

Four modes of operation are associated with the embodiments of FIG. 4. These modes are enumerated in the table of FIG. 5. The first mode of operation is data masking (masking mode). As explained previously, one of the objectives of data masking is to ensure that sections of the memory array which are not accessed by an exemplary memory function are turned off. By driving the bit line 102 and source line 104 of an exemplary MTJ element 105 to "0", no new value can be written to the MTJ 105, even if the associated word line 103 is enabled. Thus, in order to drive the bit line 102 and source line 104 to a logic value "0", the outputs of b0_BL and b0_SL must be driven to "0". One of ordinary skill will recognize that by driving the nodes PBL, NBL, PSL and NSL to "1", the buffers b0_BL and b0_SL are operationally equivalent to conventional inverters, and thus their outputs will be driven to "0".

The logic circuits illustrated in FIG. 4, provide an exemplary implementation to drive the nodes to "1" when operating in the data masking mode. Global Data (GD) refers to the data value to be written. Global Data Bar (GDB) is the complementary value of GD, except in the masking mode, wherein, both GD and GDB are set to "0". The Global BL Data masking circuit 402 drives Bit Line Data (BLD) to "1". This causes PBL and NBL to be driven to "1". Similarly, PSL and NSL are driven to "1" when GD and GDB are "0". As described above, the bit line 102 and source line 104 are thus driven to "0" and the MTJ element 105 is effectively masked.

The next mode of operation is to write a value of "0" (write-0 mode) to MTJ 105. Masking is disabled in this mode, and the value of GD corresponds to the value to be written, i.e. "0". Programming bit P[0] is set to "1" in order to enable the leg b0_BL. The complement of P[0], i.e. P[0]B is driven to "0". GDB is the complement of GD in this mode, and has a value of "1". Correspondingly, BDL is "0", and PBL and NBL are both driven to a value of "0". The operation of b0_BL is that of an inverter with an input of "0" at this stage, and a value "1" is formed at the output of the inverter, which subsequently appears as a "0" on bit line 102 (it is assumed in this illustration that write driver 202 is non-inverting, and another inverter, for example b1, may be used to invert the output of b0). In contrast, SLD is driven to "1", which causes PSL and NSL to be driven to "1", and subsequently source line 104 gets a value of "1". One of ordinary skill will understand that when the word line 103 is enabled and the bit line 102 and source line 104 are driven to "0" and "1" respectively, the MTJ element 105 is written with a value of "0".

The next mode of operation includes writing a value of "1" (write-1 mode) to MTJ 105, and the operation proceeds in a similar manner to the write-0 mode described above. GD is set to a value of 1, and subsequently bit line 102 and source line 104 receive a value of "1" and "0" respectively, word line 103 is enabled, and MTJ 105 is written with a value of "1".

The fourth and final mode of operation for an exemplary leg of a write driver, includes turning the leg off (leg-off mode), or causing the leg to enter into a high impedance state, such that the leg ceases to contribute to the drive strength of the write driver. It will be appreciated that the drive strength of write driver 202 may be programmed by turning off pull up PMOS transistor p_BL and pull down NMOS transistor n_BL, by driving the nodes PBL and NBL to "1" and "0" respectively. As shown in the table of FIG. 5, this can be achieved by setting the value of P[0] to "0", without regard to the data value which appears on GD. The operation of write driver 204 is similar.

Thus, by controlling the programming bits P[0:n], a minimum of zero and a maximum of n+1 legs may be connected in parallel to provide a proportional drive strength to the associated write driver. In an illustrative example, wherein n is 3, the table of FIG. 6 provides an exemplary mapping of the number of legs that need to be enabled for various values of P[0:3]. One of ordinary skill will understand from the table that it is not necessary that each binary encoding of P[0:3] is uniquely mapped to a certain number of legs, as several binary values of P[0:3] may correspond to the same number of legs that need to be enabled.

In another exemplary embodiment, the foregoing techniques may be employed to detect easy cells in a memory array. Programmable write drivers may be configured to the weakest setting, to write a predetermined test vector to the memory array. The data values may then be read out from the memory array and compared with the test vector in order to determine if any easy cells in the array were caused to be written at the weakest drive strength. The drive strength may be gradually increased in discrete steps and the system can be studied at each step for easy cells. It will be appreciated that read disturbs may also be detected by employing similar techniques. Once such defects in the memory array have been identified, the write drivers associated with the easy cells may be programmed at an appropriate drive strength. Thus, configuring the drivers to supply the lowest current required to flip each MTJ element in the array, will lead to a significantly lower net current consumption, and associated power savings.

Figure 7:
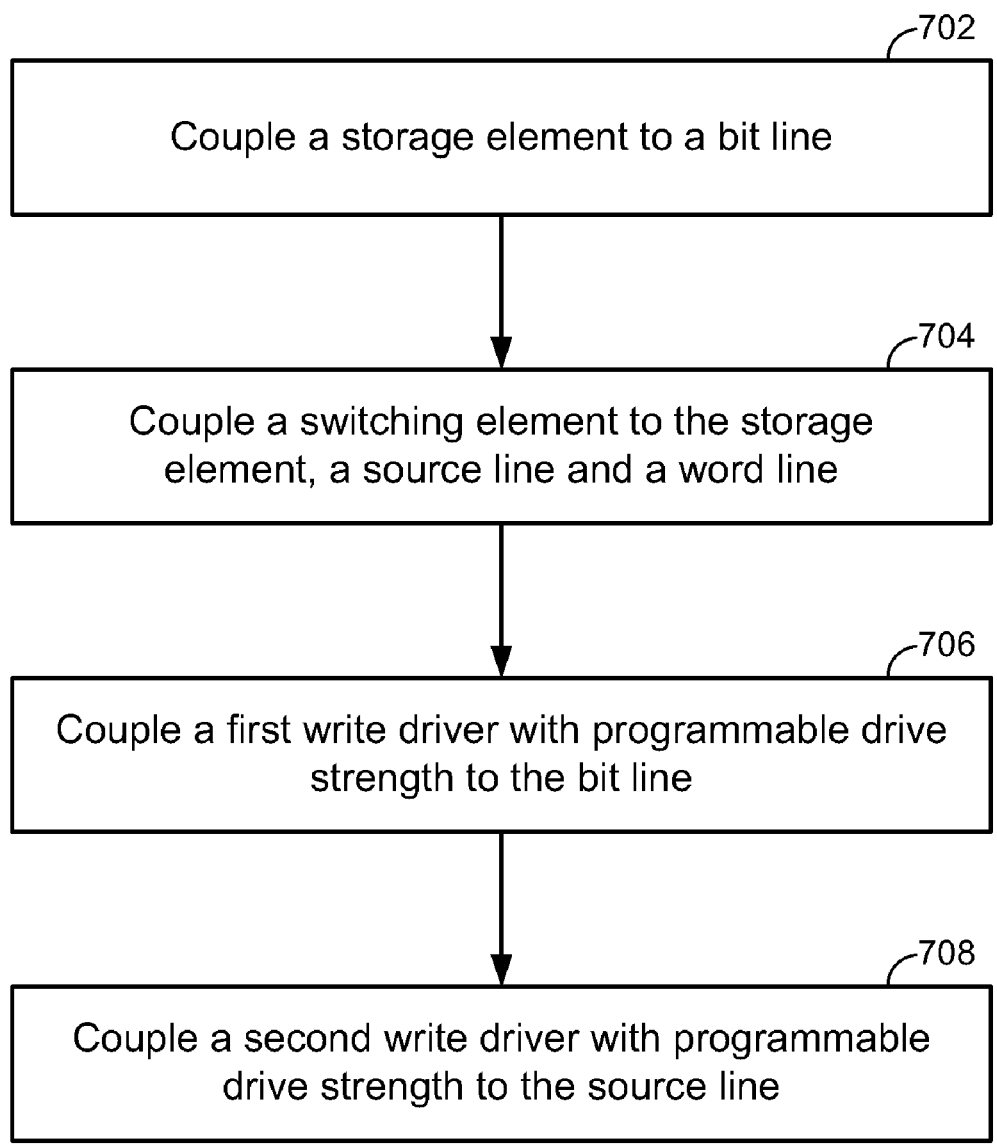
FIG. 7 is a flowchart illustrating an exemplary method of forming a non-volatile memory element according to the inventive techniques.

It will be appreciated that embodiments include various methods for performing the processes, functions and/or algorithms disclosed herein. For example, as illustrated in FIG. 7, an embodiment can include a method of forming a non-volatile memory element comprising, first coupling a storage element to a bit line (block 702). Next, at block 704, a switching element is coupled to the storage element, a source line and a word line, wherein the switching element is configured to change a logic state of the storage element. At block 706, a first write driver with programmable drive strength is coupled to the bit line. Finally at block 708, a second write driver with programmable drive strength is coupled to the source line.

It will also be appreciated that while the foregoing disclosure particularly describes an STT-MRAM array comprising MTJ storage elements and transistor switching elements, the inventive techniques can be easily applied to any non-volatile memory comprising storage elements configured to store binary data values, and which binary data values can be changed by a switching element coupled to the storage element, under the application of a DC current.

It will be further appreciated that memory devises including the MTJ storage elements described herein may be included within a mobile phone, portable computer, handheld personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A non-volatile memory element comprising:
   a storage element coupled to a bit line;
   a switching element coupled to the storage element, a source line and a word line, wherein the switching element is configured to change a logic state of the storage element;
   a first write driver with programmable drive strength coupled to the bit line; and
   a second write driver with programmable drive strength coupled to the source line, wherein in a masking mode, the first and second write drivers are configured to disable access to the storage element.

2. The non-volatile memory element of claim 1, wherein the memory element is a Magnetoresistive Random Access Memory (MRAM) element, the storage element is a magnetic tunnel junction (MTJ) storage element, and the switching element is a transistor.

3. The non-volatile memory element of claim 1, wherein the first and second write drivers comprise one or more legs electrically connected in parallel and logic to selectively disable a leg, such that effective drive strengths of the write drivers is equal to a cumulative drive strengths of the one or more legs connected in parallel, and wherein a disabled leg does not contribute to the effective drive strengths.

4. The non-volatile memory element of claim 3, wherein the one or more legs are parallel in a layout view.

5. The non-volatile memory element of claim 3, wherein each leg is an inverter comprising an optional tri-state mode, such that a disabled leg is configured to be driven to a high impedance state.

6. The non-volatile memory element of claim 3, wherein each leg comprises a pull up transistor and a pull down transistor.

7. The non-volatile memory element of claim 6, wherein the pull up transistor and the pull down transistor are individually controlled.

8. The non-volatile memory element of claim 3, wherein the first and second write drivers further comprise programming logic to disable a subset of the legs, such that the effective drive strengths of the first and second write drivers are programmed to predetermined values.

9. The non-volatile memory element of claim 3, wherein the first and second write drivers further comprise masking logic to drive binary logic zero on the bit line and source line respectively in the masking mode.

10. The non-volatile memory element of claim 1 integrated in at least one semiconductor die.

11. The non-volatile memory element of claim 1, integrated in a device, selected from the group consisting of a set top box, music player, video player, entertainment unit, navigation device, communications device, personal digital assistant (PDA), fixed location data unit, and a computer.

12. A method of forming a non-volatile memory element comprising:
   coupling a storage element to a bit line;
   coupling a switching element to the storage element, a source line and a word line, wherein the switching element is configured to change a logic state of the storage element;
   coupling a first write driver with programmable drive strength to the bit line; and
   coupling a second write driver with programmable drive strength to the source line, wherein in a masking mode, the first and second write drivers are configured to disable access to the storage element.

13. The method of claim 12 further comprising:
   forming the memory element from a Magnetoresistive Random Access Memory (MRAM) element;

forming the storage element from a magnetic tunnel junction (MTJ) storage element; and
forming the switching element from a transistor.

14. The method of claim 12, further comprising:
forming the first and second write drivers from one or more legs electrically connected in parallel; and
forming logic to selectively disable a leg, such that effective drive strengths of the drivers are equal to the cumulative drive strengths of the one or more legs connected in parallel and a disabled leg does not contribute to the effective drive strengths.

15. The method of claim 14, wherein each leg is formed from an inverter comprising an optional tri-state mode.

16. The method of claim 14, wherein each leg comprises a pull up transistor and a pull down transistor.

17. The method of claim 16, wherein the pull up transistor and the pull down transistor are individually controlled.

18. The method of claim 14, further comprising:
disabling a subset of the legs, such that the effective drive strengths of the first and second write drivers are programmed to predetermined values.

19. The method of claim 14, wherein the first and second write drivers further comprise masking logic to drive binary logic zero on the bit line and source line respectively in the masking mode.

20. The method of claim 12, further comprising:
integrating the non-volatile memory element in at least one semiconductor die.

21. The method of claim 12, further comprising
integrating the non-volatile memory element into a device, selected from the group consisting of a set top box, music player, video player, entertainment unit, navigation device, communications device, personal digital assistant (PDA), fixed location data unit, and a computer.

22. A non-volatile memory element comprising:
storage means coupled to a bit line;
switching means coupled to the storage means, a source line and a word line, wherein the switching means is configured to change a logic state of the storage means;
a first programmable write driver means with programmable drive strength coupled to the bit line; and
a second programmable write driver means with programmable drive strength coupled to the source line, wherein in a masking mode, the first and second programmable write driver means are configured to disable access to the storage means.

23. The non-volatile memory element of claim 22, wherein the first and second programmable write driver means comprise one or more buffer means electrically connected in parallel and logic means to selectively disable a buffer means, such that effective drive strengths of the programmable write drivers is equal to a cumulative drive strengths of the one or more buffer means connected in parallel, wherein a disabled buffer means does not contribute to the effective drive strengths.

24. The non-volatile memory element of claim 23, wherein the first and second programmable write driver means further comprise programming logic means to disable a subset of the buffer means, such that the effective drive strengths of the programmable write driver means is programmed to predetermined values.

25. The non-volatile memory element of claim 23, wherein the first and second programmable write driver means further comprise masking logic means to drive binary logic zero on the bit line and source line respectively in the masking mode.

26. The non-volatile memory element of claim 22 integrated in at least one semiconductor die.

27. The non-volatile memory element 22, further comprising a device, selected from the group consisting of a set top box, music player, video player, entertainment unit, navigation device, communications device, personal digital assistant (PDA), fixed location data unit, and a computer, into which the non-volatile memory element is integrated.

28. A method of forming a non-volatile memory element comprising:
step for coupling a storage element to a bit line;
step for coupling a switching element to the storage element, a source line and a word line, wherein the switching element is configured to change a logic state of the storage element;
step for coupling a first write driver with programmable drive strength to the bit line; and
step for coupling a second write driver with programmable drive strength to the source line, wherein in a masking mode, the first and second write drivers are configured to disable access to the storage element.

29. The method of claim 28 comprising step for forming the memory element from a Magnetoresistive Random Access Memory (MRAM) element, step for forming the storage element from a magnetic tunnel junction (MTJ) storage element, and step for forming the switching element from a transistor.

30. The method of claim 28, comprising step for forming the first and second write drivers from one or more legs electrically connected in parallel and step for forming logic to selectively disable a leg, such that effective drive strengths of the drivers are equal to the cumulative drive strengths of the one or more legs connected in parallel and a disabled leg does not contribute to the effective drive strengths.

31. The method of claim 30, wherein the first and second write drivers further comprise programming logic to disable a subset of the legs, such that the effective drive strengths of the first and second write drivers are programmed to predetermined values.

32. The method of claim 30, wherein the first and second write drivers further comprise masking logic to drive binary logic zero on the bit line and source line respectively in the masking mode.

* * * * *